(12) United States Patent
Feng et al.

(10) Patent No.: US 9,502,410 B1
(45) Date of Patent: Nov. 22, 2016

(54) SEMICONDUCTOR STRUCTURE AND MANUFACTURING METHOD THEREOF

(71) Applicant: UNITED MICROELECTRONICS CORP., Hsin-Chu (TW)

(72) Inventors: Li-Wei Feng, Kaohsiung (TW); Shih-Hung Tsai, Tainan (TW); Hon-Huei Liu, Kaohsiung (TW); Chao-Hung Lin, Changhua County (TW); Nan-Yuan Huang, Tainan (TW); Jyh-Shyang Jenq, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/792,591

(22) Filed: Jul. 6, 2015

(30) Foreign Application Priority Data

Jun. 9, 2015 (CN) .......................... 2015 1 0311627

(51) Int. Cl.
| | | |
|---|---|---|
| *H01L 27/088* | (2006.01) | |
| *H01L 29/78* | (2006.01) | |
| *H01L 21/28* | (2006.01) | |
| *H01L 29/06* | (2006.01) | |
| *H01L 21/8234* | (2006.01) | |
| *H01L 21/762* | (2006.01) | |
| *H01L 21/306* | (2006.01) | |
| *H01L 27/092* | (2006.01) | |

(52) U.S. Cl.
CPC ..... *H01L 27/0886* (2013.01); *H01L 21/30604* (2013.01); *H01L 21/76224* (2013.01); *H01L 21/823431* (2013.01); *H01L 21/823481* (2013.01); *H01L 27/088* (2013.01); *H01L 27/092* (2013.01); *H01L 29/0649* (2013.01); *H01L 29/785* (2013.01); *H01L 29/7842* (2013.01)

(58) Field of Classification Search
CPC ............. H01L 27/0886; H01L 27/088; H01L 27/092; H01L 29/0649; H01L 29/785; H01L 29/7842; H01L 21/30604; H01L 21/76224; H01L 21/823431; H01L 21/823481
USPC ......... 257/77, 288, 328, 329, 347, 369, 401, 257/E27.059, E27.06, E27.112, E29.025, 257/E29.027, E21.09, E21.409, E21.421; 438/157, 283, 300, 303, 424, 592
See application file for complete search history.

(56) References Cited

U.S. PATENT DOCUMENTS

| | | | |
|---|---|---|---|
| 8,410,544 B2 | 4/2013 | Chan | |
| 8,426,923 B2 | 4/2013 | Lee | |
| 2012/0049294 A1* | 3/2012 | Chen | ............... H01L 21/823431 257/401 |
| 2014/0124860 A1* | 5/2014 | Cheng | ................... H01L 21/845 257/347 |
| 2016/0163851 A9* | 6/2016 | Yu | ................... H01L 21/823418 257/401 |
| 2016/0190262 A1* | 6/2016 | Xie | ................... H01L 29/41758 257/401 |
| 2016/0190305 A1* | 6/2016 | JangJian | ............... H01L 29/785 257/401 |
| 2016/0225906 A1* | 8/2016 | Wang | ................. H01L 29/7856 257/401 |

* cited by examiner

*Primary Examiner* — Dao H Nguyen
(74) *Attorney, Agent, or Firm* — Winston Hsu; Scott Margo

(57) ABSTRACT

The present invention provides a semiconductor structure, including a substrate having a first fin structure and a second fin structure disposed thereon, a first isolation region located between the first fin structure and the second fin structure, a second isolation region located opposite the first fin structure from the first isolation region, and at least an epitaxial layer disposed on the side of the first fin structure and the second fin structure. The epitaxial layer has a bottom surface, the bottom surface extending from the first fin structure to the second fin structure, and the bottom surface is lower than a bottom surface of the first isolation region and a top surface of the second isolation region.

8 Claims, 7 Drawing Sheets

A-A'

B-B'

A-A'

B-B'

SEMICONDUCTOR STRUCTURE AND MANUFACTURING METHOD THEREOF

BACKGROUND OF THE INVENTION

1. Field of the Invention

The invention relates to a semiconductor structure and fabrication method thereof, and more particularly, to a semiconductor structure with better quality epitaxial layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

Nevertheless, conventional FinFET fabrication of forming recesses after removing part of fin-shaped structures to accommodate the growth of epitaxial layer typically causes the fin-shaped structures to be lower than the surrounding shallow trench isolation (STI) as a result of over-etching, thereby influencing the formation of epitaxial layer afterwards. Hence, how to improve the current FinFET fabrication process for resolving this issue has become an important task in this field.

SUMMARY OF THE INVENTION

The present invention provides a semiconductor structure, comprising a substrate having a first fin structure and a second fin structure disposed thereon, a first isolation region located between the first fin structure and the second fin structure, a second isolation region located opposite the first fin structure from the first isolation region, and at least an epitaxial layer disposed on the side of the first fin structure and the second fin structure, wherein the epitaxial layer has a bottom surface, the bottom surface extending from the first fin structure to the second fin structure, and the bottom surface is lower than a bottom surface of the first isolation region and a top surface of the second isolation region.

The present invention further provides a method for forming a semiconductor structure, comprising: firstly, a substrate having a first fin structure and a second fin structure disposed thereon is provided, afterwards, a first isolation region located between the first fin structure and the second fin structure is formed, a second isolation region located opposite the first fin structure from the first isolation region is also formed, and at least an epitaxial layer disposed on the side of the first fin structure and the second fin structure is then formed, wherein the epitaxial layer has a bottom surface, the bottom surface extending from the first fin structure to the second fin structure, and the bottom surface is lower than a bottom surface of the first isolation region and a top surface of the second isolation region.

The feature of the present invention is each fin structure is partially removed during the process for forming the fin structure, and the removed region is used for growing the epitaxial layer. In this way, the quality of the epitaxial layer can be increased, thereby improving the semiconductor device performance. Besides, the epitaxial layer of the present invention contacts more than one fin structure. In other words, the source/drain regions of a plurality of transistors can be formed simultaneously, and further improves the convenience of the process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 8 are schematic diagrams showing a method for fabricating a semiconductor structure according to a first preferred embodiment of the present invention, wherein:

FIG. 1 to FIG. 5 are 3D schematic diagrams showing the semiconductor structure according to a first preferred embodiment of the present invention, and FIG. 6 to FIG. 8 are cross section schematic diagrams showing the semiconductor structure according to a first preferred embodiment of the present invention.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
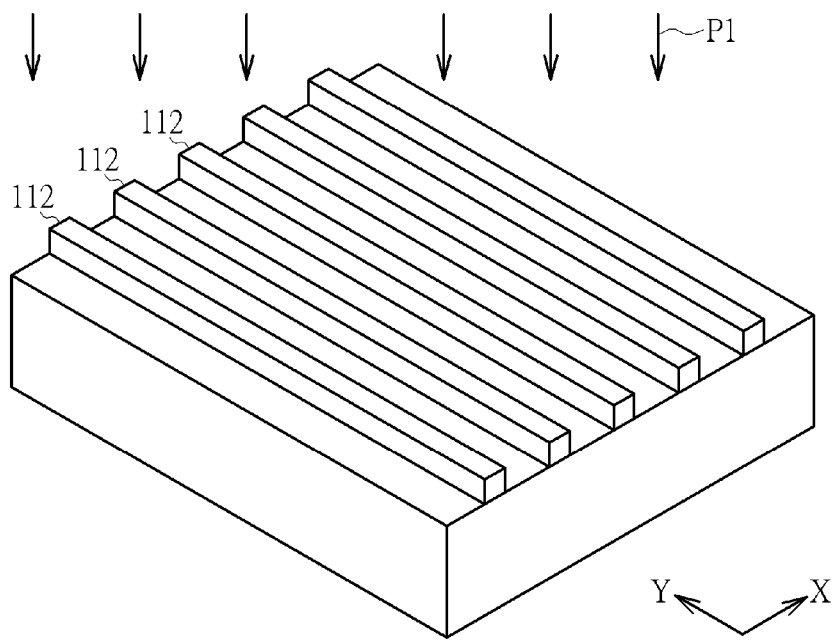

FIG. 1 to FIG. 8 are schematic diagrams showing a method for fabricating a semiconductor structure according to a first preferred embodiment of the present invention. Please refer to FIG. 1. FIG. 1 is a schematic diagram showing a semiconductor structure at the beginning of the fabrication process. As this stage, a semiconductor structure having a substrate 100 and a plurality of fin structures 112 disposed thereon is provided. In addition, the substrate 100 may be chosen from semiconductor substrate such as a bulk silicon substrate, a silicon containing substrate, a III-V semiconductor-on-silicon (such as GaAs-on-silicon) substrate, a graphene-on-silicon substrate, a silicon-on-insulator (SOI) substrate, a silicon dioxide substrate, an aluminum oxide substrate, a sapphire substrate, a germanium containing substrate or an alloy of silicon and germanium substrate.

More precisely, the method for fabricating the fin-shaped structures 112 may include the following processes, but not limited thereto. First, a bulk substrate (not shown) is provided and a hard mask layer (not shown) is formed thereon. The hard mask layer is then patterned through a photolithographic and an etching process (photo-etching process), so as to define the location for forming fin structures 112 in the bulk substrate. Afterwards, an etching process is performed to form fin structures 112 in the bulk substrate. After the above processes, the fabrication method for the fin structures 112 is complete. In this case, the fin structures 112 may be regarded as protruding from the surface of the substrate 100 and the compositions of the fin structures 112 and the substrate 100 may be the same, such as monocrystalline silicon. In another case, when the substrate is chosen from a III-V semiconductor-on-silicon substrate rather than the above-mentioned bulk silicon substrate, the main compositions of the fin-shaped structures may be the same as that of the III-V semiconductor and differ from that of the underlying substrate.

Figure 2:
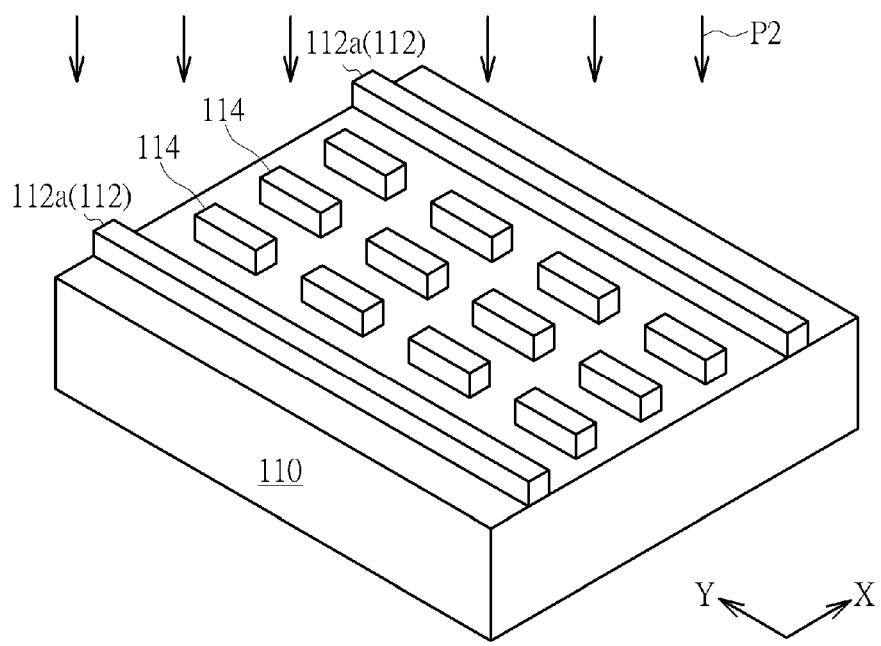

As shown in FIG. 2, a photo-etching process P2 is then performed, to remove parts of the fin structure 112, and so as to form a plurality of fin structures 114 which are separated from each other. More precisely, another hard mask (not shown) can be formed on the substrate, and the hard mask preferably consists of a plurality of strip-shaped photoresist patterns arranged parallel to each other, wherein the extending direction of each strip-shaped photoresist pattern is preferably perpendicular to the extending direction of each fin structure 112. Therefore, after the etching process is performed, each fin structure 112 will be segmented into a plurality of fin structures 114 which are separated from each other. It is noteworthy that in this step, the removing region of the fin structure 112 is the region that an epitaxial layer will be formed in the following steps. It will be described again in the following paragraphs. In addition, in this step, parts of the fin structure may be regarded as the dummy fin structure (such as the dummy fin structure 112a shown in FIG. 2), and the dummy fin structure 112a will not be etched.

Besides, in the method mentioned above, after the fin structures 112 are formed, another photo-etching process P2 is then formed to remove parts of the fin structures 112, so as to form the fin structures 114. However, in another embodiment, after the strip-shaped photoresist patterns are formed, an etching process can be performed to remove parts of the photoresist patterns, thereby forming a plurality of hard masks separated from each other. Afterwards, another etching process is then performed, so as to transfer the patterns of the rest of the hard masks to the substrate 100, and the fin structure 114 shown in FIG. 2 can be formed. This should also be within the scope of the present invention. In addition, the hard masks mentioned above can be formed on the substrate through a sidewalls image transfer (SIT) process. It is a well-known technology and will not be redundantly described here.

Figure 3:
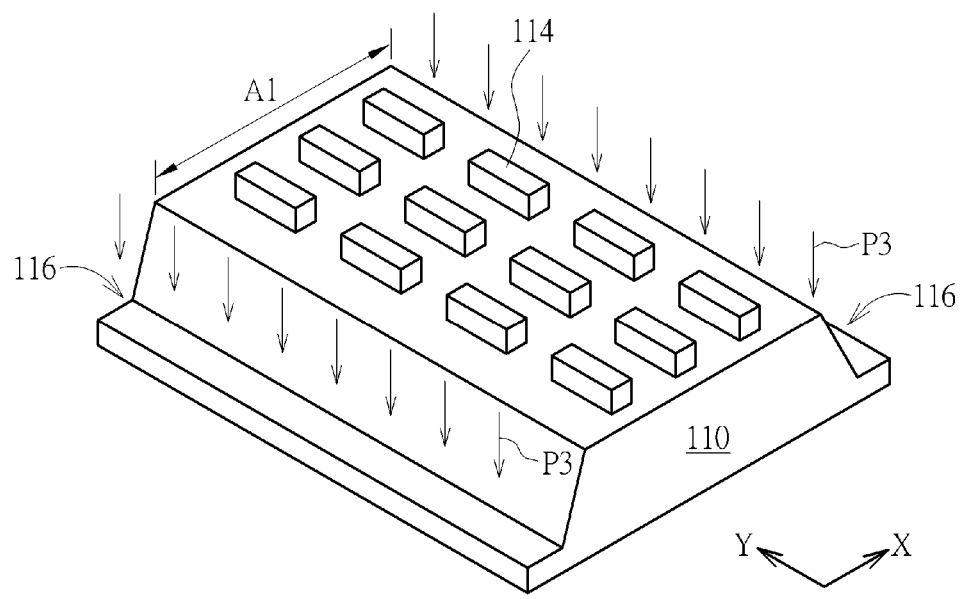

Next, a photoresist layer (not shown) is used as the hard mask to perform a fin-cut process. As shown in FIG. 3, after the fin-cut process P3 is performed, parts of the fin structure 112 and parts of the substrate are removed, and the recess 116 is therefore formed. Generally, the recess 116 will be filled in the isolation layer in the following steps, so as to form shallow trench isolation (STI). The region A1 which surrounded by the recess 116 can be defined as the active area of the semiconductor device, namely the region comprising the semiconductor device such as transistors disposed therein.

Figure 4:
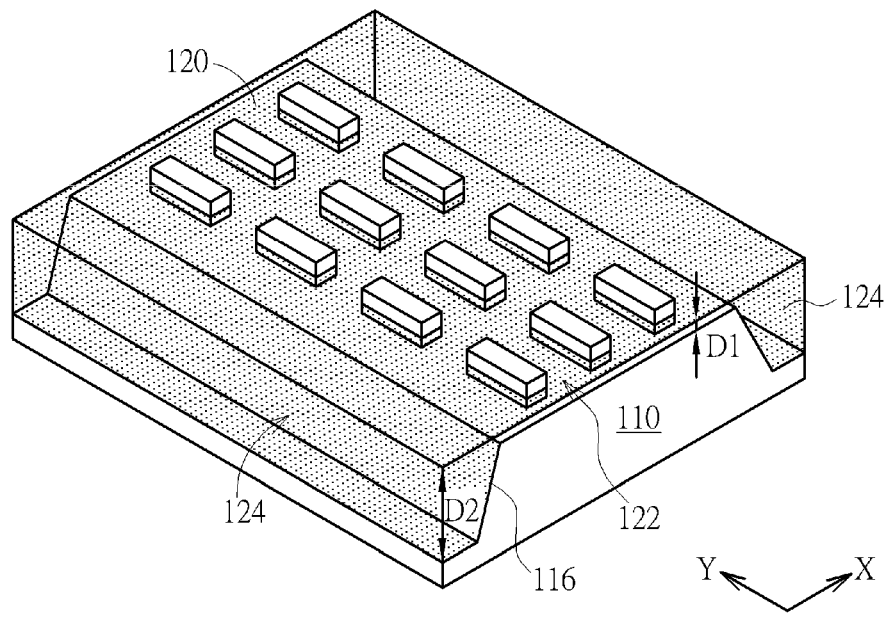

As shown in FIG. 4, a flat isolation layer 120 is entirely formed on the substrate 110, covering each fin structure 114 and also filling in the recess 116. The isolation layer 120 comprises isolating materials such as silicon oxide or silicon nitride. It is noteworthy that the thickness of the isolation layer 120 within the active area A1 is smaller than the thickness of each fin structure 114. More precisely, in the present invention, the isolation layer 120 disposed between each of the fin structures 114 can be defined as a first isolation region 122, and the isolation layer 120 disposed in the recess 116 can be defined as a second isolation region 124, the depth D2 of the second isolation region 124 being larger than the depth D1 of the first isolation region 122. In addition, before the isolation layer 120 is formed, a liner can be selectively formed between the substrate and the isolation layer 120, and it should also be within the scope of the present invention.

Figure 5:
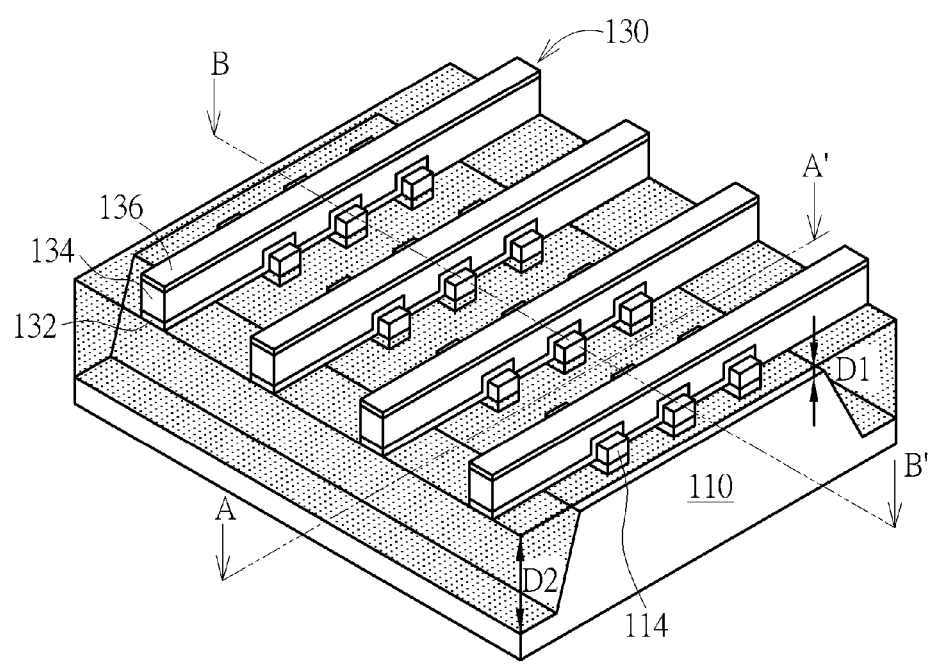

As shown in FIG. 5, a plurality of gate structures 130 are formed on the isolation layer 120 and cross over each fin structure 114. Each gate structure 130 includes a gate dielectric layer 132, a gate conductive layer 134 and a cap layer 136. The material of the gate dielectric layer 132 may include silicon oxide (SiO), silicon nitride (SiN), silicon oxynitride (SiON), or a high-k dielectric material having a dielectric constant (k value) larger than 4 such as metallic oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof. The material of the gate conductive layer 134 may include undoped polysilicon, heavily doped polysilicon, or one or a plurality of metal layers such as a work function metal layer, a barrier layer and a low-resistance metal layer, etc. The cap layer 136 may include a single-layer structure or multi-layer structure made of dielectric materials such as silicon oxide (SiO), silicon nitride (SiN), silicon carbide (SiC), silicon carbonitride (SiCN), silicon oxynitride (SiON) or a combination thereof. Besides, spacers should also be comprised and disposed on two sides of the gate structure 130, but in order to simplify the figure, spacers are not shown in FIG. 5, but it will be described in the following paragraphs and shown in FIG. 6.

Figure 6:
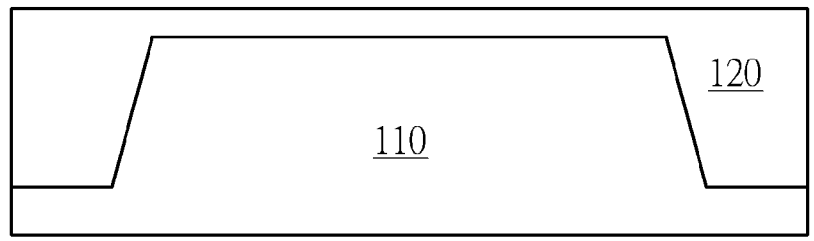
Figure 6:
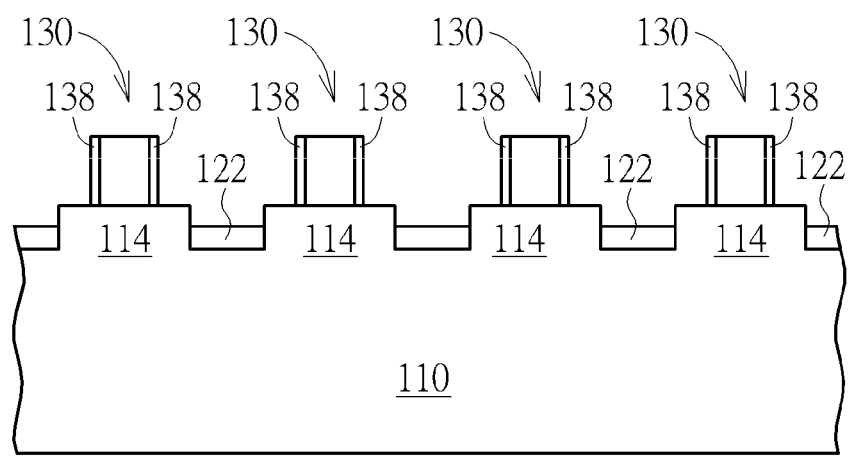

FIG. 6 show the cross section diagrams along the cross section line A-A' and along the cross section line B-B' of FIG. 5 respectively. Please also refer to FIG. 5, the cross section diagrams along the cross section line A-A' is the X-direction cross section diagram, and the cross section diagrams along the cross section line B-B' is the Y-direction cross section diagram. In order to simplify the description, the following figures are shown in cross section views, the relative position of each element can be known by referring the FIGS. 5-6. In addition, the spacers 138 are shown in the Y-direction cross section diagram of FIG. 6.

Figure 7:
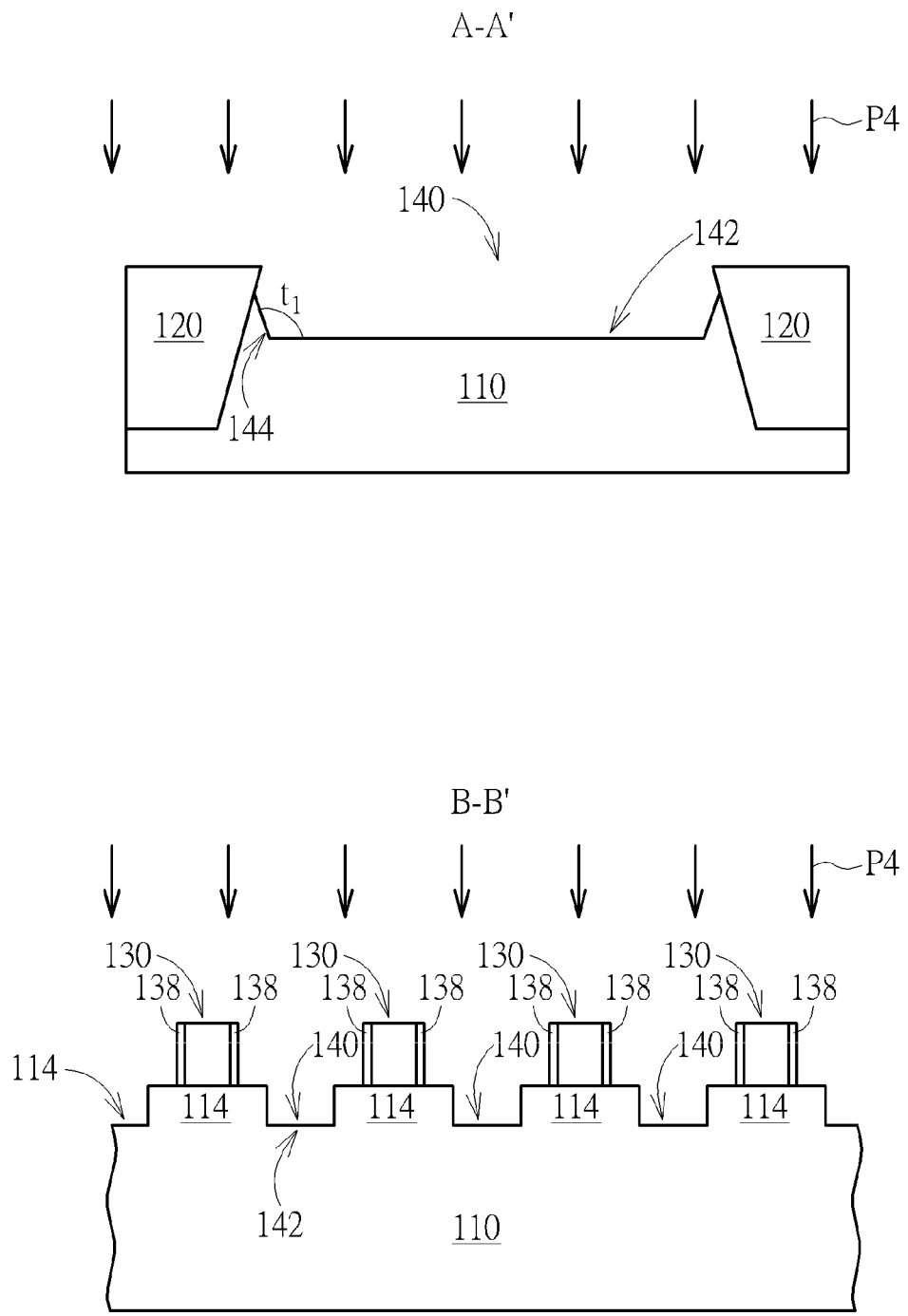

FIG. 7 shows the cross section diagram of the present invention after performing an epitaxial recess etching process. As shown in FIG. 7, a patterned photoresist layer (not shown) is formed on the isolation layer 120. The patterned photoresist layer includes a plurality of openings, each opening disposed between two adjacent gate structures 130, and afterwards, an etching process P4 is then performed, to form the recesses 140 on two sides of each gate structure 130. During the process for etching the recess 140, not only is the isolation layer 120 partially etched, but the fin structure 114 and the substrate 110 may also be etched simultaneously, or they will be etched in the following etching processes, so the bottom surface 142 of the recess 140 may lower than the top surface of the substrate 110 within the active area A1. When viewed in Y-direction cross section diagram (along the cross section line B-B'), the bottom surface 142 of the recess 140 is lower than the bottom surface of the fin structure 114. Besides, when viewed in X-direction cross section diagram (along the cross section line A-A'), the recess 140 has two sidewalls 144, the angle t1 between the bottom surface 142 and the sidewall 144 is preferably larger than 90 degrees, but not limited thereto. The shapes of the recess can be adjusted according to actual requirements.

Figure 8:
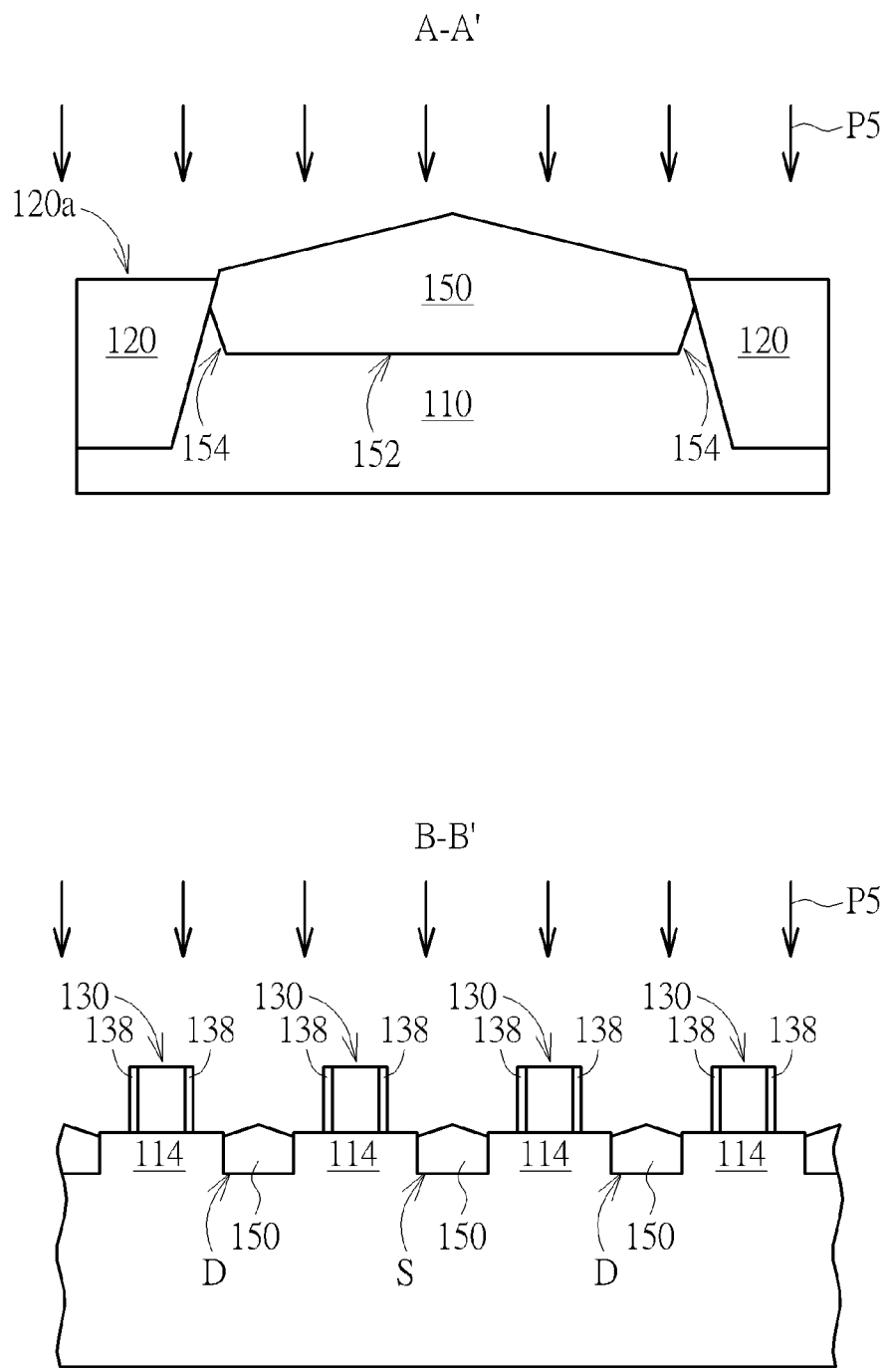

Finally, FIG. 8 shows the cross section diagram of the present invention after performing a selective epitaxy growing process. As shown in FIG. 8, after the patterned photoresist layer is removed, a selective epitaxy growing (SEG) process P5 is performed to form an epitaxial layer 150 in the recess 140, and the epitaxial layer 150 fills up the recess 140. It is well-known to those skilled in the art that in the SEG process P5, the epitaxial layer 150 is to grow along each surface of the recess 140. Therefore, the epitaxial layer 150 has a bottom surface 152, and the bottom surface 152 is lower than the top surface 120a of the isolation layer 120 (it is also the top surface of the second isolation region 124). Furthermore, the bottom surface 152 is also lower than the bottom surface of the isolation layer 122 (please also refer to FIG. 6). In addition, the angle between the flat bottom surface 152 of the epitaxial layer 150 and the sidewall 154 is preferably larger than 90 degrees. It is noteworthy that the epitaxial layer 150 disposed on sidewalls of each fin structure 114, and the bottom surface 152 at least extends through more than two fin structures 114. In other words, the bottom surface 152 of the epitaxial layer 150 disposed in the substrate 110, and the epitaxial layer 150 directly contacts more than two fin structures 114.

Figure 9:
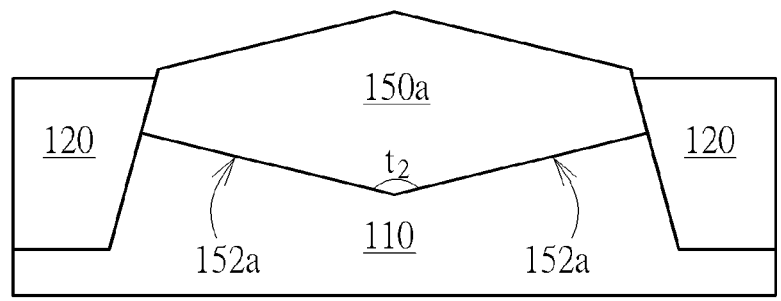
FIG. 9 shows the cross section diagram of the semiconductor structure according to another embodiment of the present invention.

In the embodiment mentioned above, the epitaxial layer 150 has a flat bottom surface 152. But in another embodiment of the present invention, as shown in FIG. 9, which shows the cross section diagram of the semiconductor structure according to another embodiment of the present invention. In this embodiment, the bottom surface 152a of the epitaxial layer 150a it is not a flat surface and has an angle t2. It should also be within the scope of the present invention.

In another embodiment, the epitaxial layer 150, 150a may include a silicon-germanium epitaxial layer suited for a PMOS transistor, or a silicon-carbide epitaxial layer suited for an NMOS transistor, depending upon the electrical properties of the Multi-gate MOSFET. The epitaxial layer 150,150a is formed in the recess R, and grows conformally along the shape of the recess R, therefore having a hexagon-shaped profile structure. Thereafter, an ion implantation process may be performed to dope impurities, or impurities may be doped while performing the SEG process P5, so that the epitaxial layer 150 can be used as a source/drain region. After the epitaxial layer 150 is formed, a silicide process (or a salicide process, not shown) may be performed to form silicide in the source/drain region, wherein the silicide process may include a post clean process, a metal depositing process, an annealing process, a selective etching process, or a test process, etc. Thereafter, other processes may be performed after the silicide process is performed.

Figure 10:
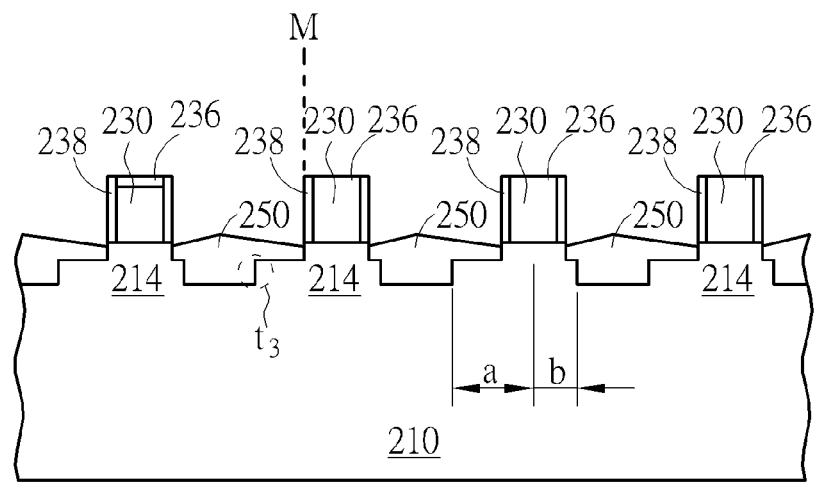
FIG. 10 shows the cross section diagram of the semiconductor structure according to another embodiment of the present invention.

FIG. 10 shows the cross section diagram of the semiconductor structure according to another embodiment of the present invention. In this embodiment, the substrate 210 comprises a plurality of fin structures 214 and a plurality of gate structures 230 disposed thereon, each gate structure 230 includes the cap layer 236 disposed on the top of the gate structure 230, and the spacers 238 disposed on two sidewalls of the gate structure 230. In addition, the epitaxial layers 250 are disposed on two sides of every gate structure 230. The differences between FIG. 10 and the Y-axis direction cross section of FIG. 8 is that in this embodiment, since some overlay errors may occur during the process, a misalignment will exist between the gate structure 230 and the fin structure 214, and the gate structure 230 will be shifted towards a specific direction. In this case, the middle line M of one fin structure 214 is regarded as the symmetry axis, and each fin structure 214 is covered by the gate structure 230 asymmetrically. In other words, the distances between the central point of the gate structure 230 and two ends of the fin structure 214 are labeled as "a" and "b" respectively, and the value a and value b are different. Therefore, the two epitaxial layers 250 disposed on two sides of the gate structure 230 (especially the gate structure disposed near the edges of the active area) may have different volumes.

Besides, after the gate structure 230 are completed, and during the process for forming the epitaxial recess through an etching process, a photoresist layer (not shown) will firstly formed, the opening of the photoresist layer may be larger than the gap between every two adjacent gate structure 230, so as to perform a self-aligned etching by using the spacer 238 of the gate structure 230 and/or the cap layer 236. Therefore during the process mentioned above, partial sidewall of the fin structure 214 may also be removed, and the fin structure 214 will have a stepped-shaped sidewall profile, since the epitaxial layer 250 grows along each surface of the recess, so the epitaxial layer 250 will also have a stepped-shaped sidewall profile (such as the angle t3 shown in FIG. 10). Besides, the first embodiment of the present invention mentioned above may also include the stepped-shaped sidewall profile of this embodiment, and will not be described again.

The feature of the present invention is each fin structure is partially removed during the process for forming the fin structure, and the removed region is used for growing the epitaxial layer. In this way, the quality of the epitaxial layer can be increased, thereby improving the semiconductor device performance. Besides, the epitaxial layer of the present invention contacts more than one fin structure. In other words, the source/drain regions of a plurality of transistors can be formed simultaneously, and further improves the convenience of the process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate having a first fin structure and a second fin structure disposed thereon;
   a first isolation region located between the first fin structure and the second fin structure;
   a second isolation region located opposite the first fin structure from the first isolation region; and
   at least an epitaxial layer disposed on the side of the first fin structure and the second fin structure, wherein the epitaxial layer has a bottom surface, the bottom surface extending from the first fin structure to the second fin structure, and the bottom surface is lower than a bottom surface of the first isolation region and a top surface of the second isolation region, in addition, the epitaxial layer has a stepped-shaped sidewall profile.

2. The semiconductor structure of claim 1, further comprising at least one gate structure crossing over the first fin structure and the second fin structure.

3. The semiconductor structure of claim 2, wherein the gate structure covers the first fin structure asymmetrically.

4. The semiconductor structure of claim 2, wherein at least one gate structure comprises two epitaxial layers disposed on two sides of the gate structure respectively, wherein the two epitaxial layers have different volumes.

5. The semiconductor structure of claim 1, wherein the depth of the second isolation region is larger than the depth of the first isolation region.

6. The semiconductor structure of claim 1, wherein the bottom surface of the epitaxial layer is a flat surface, and the epitaxial layer further comprises two sidewalls.

7. The semiconductor structure of claim 6, wherein the angle between the flat surface and one of the sidewall is larger than 90 degrees.

8. The semiconductor structure of claim 1, wherein the bottom surface of the epitaxial layer has an angle.

* * * * *